(12) United States Patent
Hubbard et al.

(10) Patent No.: US 8,511,004 B2
(45) Date of Patent: Aug. 20, 2013

(54) SEISMICALLY STABLE FLOORING

(75) Inventors: Don A. Hubbard, Valencia, CA (US); Gil A. Moreno, San Clemente, CA (US); Zoltan A. Kemeny, Tempe, AZ (US)

(73) Assignee: Worksafe Technologies, Valencia, CA (US)

( * ) Notice: Subject to any disclaimer, the term of this patent is extended or adjusted under 35 U.S.C. 154(b) by 0 days.

(21) Appl. No.: 13/445,638

(22) Filed: Apr. 12, 2012
(Under 37 CFR 1.47)

(65) Prior Publication Data

US 2012/0266558 A1    Oct. 25, 2012

Related U.S. Application Data

(63) Continuation of application No. 11/731,425, filed on Mar. 30, 2007, now Pat. No. 8,156,696, which is a continuation-in-part of application No. 11/208,584, filed on Aug. 22, 2005, now Pat. No. 7,290,375, said application No. 11/731,425 is a continuation-in-part of application No. 10/522,211, filed as application No. PCT/US03/21930 on Jul. 15, 2003, now Pat. No. 7,784,225.

(60) Provisional application No. 60/651,976, filed on Feb. 14, 2005, provisional application No. 60/816,681, filed on Jun. 26, 2006.

(51) Int. Cl.
*E04B 1/98* (2006.01)
*E02D 27/34* (2006.01)

(52) U.S. Cl.
CPC .. *E04B 1/98* (2013.01); *E02D 27/34* (2013.01)
USPC ............................................. 52/167.5; 52/167.6

(58) Field of Classification Search
CPC .................................. E04B 1/98; E02D 27/34
USPC ........... 52/167.5, 167.6, 167.1, 167.4, 220.2, 52/167.8; 384/36, 610, 49; 14/73.5
See application file for complete search history.

(56) References Cited

U.S. PATENT DOCUMENTS

| | | |
|---|---|---|
| 2,014,643 A | 9/1935 | Bakker |
| 3,606,704 A | 9/1971 | Denton |
| 4,371,143 A | 2/1983 | Ishida et al. |

(Continued)

FOREIGN PATENT DOCUMENTS

| | | |
|---|---|---|
| JP | 01-097752 | 4/1989 |
| JP | H01-174737 | 7/1989 |

(Continued)

OTHER PUBLICATIONS

USPTO Office Action dated Dec. 23, 2009 in parent U.S. Appl. No. 11/731,425, filed Mar. 30, 2007.

(Continued)

*Primary Examiner* — Brandon Painter
(74) *Attorney, Agent, or Firm* — Stout, Uxa, Buyan & Mullins; Carlos A. Fisher

(57) ABSTRACT

Methods and systems for isolating objects from seismic vibration, isolation flooring systems, vibrational damping devices, and methods for their use are disclosed. The present invention has the advantage of having a minimum of moving parts, and being extraordinarily easy to install and inspect. In preferred embodiments, the invention is drawn to methods of isolating sensitive objects from the full extent of seismic vibrations.

19 Claims, 3 Drawing Sheets

(56) References Cited

U.S. PATENT DOCUMENTS

| | | |
|---|---|---|
| 4,662,133 A | 5/1987 | Kondo |
| 4,726,161 A | 2/1988 | Yaghoubian |
| 4,763,869 A | 8/1988 | Nakamura et al. |
| 4,801,122 A | 1/1989 | Stahl |
| 4,917,211 A | 4/1990 | Yamada et al. |
| 4,922,670 A | 5/1990 | Naka et al. |
| 5,599,106 A | 2/1997 | Kemeny |
| 5,689,919 A | 11/1997 | Yano |
| 5,791,096 A | 8/1998 | Chen |
| 5,816,559 A | 10/1998 | Fujimoto |
| 5,934,029 A | 8/1999 | Kawai et al. |
| 5,953,870 A | 9/1999 | Jette |
| 6,052,955 A | 4/2000 | Haider |
| 6,324,795 B1 | 12/2001 | Stiles et al. |
| 6,550,195 B1 | 4/2003 | Cooper et al. |
| 7,290,375 B2 | 11/2007 | Kemeny |
| 2012/0174500 A1* | 7/2012 | Yakoub .................. 52/167.4 |
| 2012/0222369 A1* | 9/2012 | Kemeny .................. 52/167.5 |

FOREIGN PATENT DOCUMENTS

| | | |
|---|---|---|
| JP | 06-042158 | 2/1994 |
| JP | H09-507701 | 8/1997 |
| JP | 2000-170831 | 6/2000 |
| JP | 2001-512806 A | 8/2001 |
| JP | 2003-293567 | 10/2003 |
| WO | WO 95/22012 A1 | 8/1995 |
| WO | WO2004-007871 | 1/2004 |

OTHER PUBLICATIONS

USPTO Office Action dated Jul. 20, 2010 in parent U.S. Appl. No. 11/731,425, filed Mar. 30, 2007.

USPTO Office Action dated Jun. 30, 2011 in parent U.S. Appl. No. 11/731,425, filed Mar. 30, 2007.

* cited by examiner

SEISMICALLY STABLE FLOORING

This application is a continuation of U.S. patent application Ser. No. 11/731,425, filed Mar. 30, 2007 (now U.S. Pat. No. 8,156,696), which was a continuation in part of U.S. patent application Serial No. 11/208,584 (now U.S. Pat. No. 7,290,375), filed Aug. 22, 2005, which claimed priority to U.S. Provisional Application 60/651,976, filed Feb. 14, 2005; U.S. patent application Ser. No. 11/731,425 (now U.S. Pat. No. 8,156,696) is also a continuation-in-part of U.S. patent application Ser. No. 10/522,211, having a §371 date of Apr. 4, 2006 (now U.S. Pat. No. 7,784,225), which was a U.S. national filing pursuant to 35 USC §371 of International Patent Application No. PCT/US03/21930, filed Jul. 15, 2003; and U.S. patent application Ser. No. 11,731,425 (now U.S. Pat. No. 8,156,696) further claimed priority pursuant to 35 USC §119(e) to U.S. provisional application Serial No. 60/816,681, filed Jun. 26, 2006. Each of these patent applications is hereby specifically incorporated by reference in its entirety as part of the present application.

The present invention is directed to isolation flooring components for aiding in the prevention of personal injury and property damage caused by displacement of heavy, valuable, expensive, and or delicate objects and equipment during a seismic event or other event causing vibration in the building housing such objects or equipment.

Such equipment may comprise, without limitation, computer components such as mainframe computers and other computer components; electrical equipment such as dynamos and the like; hazardous chemical storage cabinets (thus preventing possible injury, explosion, fire, and the like); art works (such as, without limitation, sculptures and paintings); machinery; people; and the like. Collectively, the materials to be protected against damage or injury will be referred to herein as "objects".

Earthquake shaking and damage are the result of three basic types of elastic wave; two of these waves are capable of traveling through rock. The first of these three waves is the primary or P wave; this wave is a compression wave and propagates linearly in the direction of travel through rock and fluid; this is the fastest traveling seismic wave. The secondary or S wave generally moves more slowly than the P wave and its wave movement is at right angles (up and down, and/or side-to-side) to the direction of travel. It is the S wave that causes most damage to structures.

The third type of wave is called a surface wave, and is restricted to the ground surface. This type of wave has a motion similar to ripples on the surface of water. There are two types of surface waves. The first is called a Love wave and is similar to that of an S wave having a side-to-side motion with little or no vertical displacement; these waves can cause substantial damage to objects since virtually all the energy is employed within a horizontal plane. The second type of surface wave is called a Rayliegh wave, which is like an ocean wave and can cause displacement in both the vertical and horizontal plane relative to the direction of travel.

P and S waves have a characteristic which further affects shaking: when these waves move through layers of rock in the crust they are reflected or refracted at the interfaces between rock types. Whenever either wave is refracted or reflected, some of the energy of one type is converted to waves of the other type. For an example, as a P wave travels upwards and strikes the bottom of a layer of alluvium, part of its energy will pass upward through the alluvium as a P wave and part will pass upward as the converted S-wave motion. This means that the direction of shaking (e.g., left to right, front to back, or diagonally) in a given location is usually not entirely predictable, as it is dependent upon factors including the direction of wave travel and the nature (such as the density and homogeneity) of the crust in the general location in which the shaking is to be experienced. This in turn depends upon the location of the fault whose rupture has caused the waves.

Two alternative approaches have been traditionally utilized to prevent or limit damage or injury to objects due to seismic events. In the first approach, used particularly with structures themselves, the objects are made strong enough to withstand the largest anticipated earthquake. However, in addition to the maximum tremor magnitude and directionality of shaking being relatively unpredictable, this method is quite expensive and is not necessarily suitable for objects to be housed within a structure.

In the second approach the objects are isolated from the vibration such that the objects do not experience a major portion of the seismic waves. In certain cases, isolation flooring, for example "earthquake isolation flooring", has been used or proposed. Such flooring has generally comprised a sliding plate, a support frame slidably mounted on the plate with low friction elements interposed therebetween, a plurality of springs disposed horizontally between the support frame and the plate, a floor mounted on the support frame through vertically disposed springs, a number of dampers disposed vertically between the support frame and the floor, and a latch to secure the vertical springs during normal use.

Certain disadvantages to such pre-existing systems include the fact that it is difficult to establish the minimum acceleration at which the latch means is released; it is difficult to reset the latch means after the floor has been released; it may be difficult to restore the floor after it has once moved in the horizontal direction; there is a danger of rocking on the vertical springs; and since the transverse rigidity of the vertical springs cannot be ignored with regard to the horizontal springs, the establishment of the horizontal springs and an estimate of their effectiveness, are made difficult.

Ishida et al., U.S. Pat. No. 4,371,143 have proposed an improved isolation floor that comprises length adjustment means for presetting the minimum acceleration required to initiate the isolation effects of the flooring in part by adjusting the length of the springs. The floor is said to automatically restore to its normal condition after having once been subjected to a seismic wave.

Yamada et al. describe a seismic isolation apparatus placed between a foundation and a floor slab that comprises an upper friction plate affixed to an object to be protected from seismic acceleration comprising a material impregnated with oil, a lower friction plate comprising a hard chromium or nickel plate, and a horizontally placed spring system affixed to the object and the foundation to provide a restoring force. To reduce the response acceleration of the object even further, certain of the friction places may be replaced with ball bearings.

Stahl (U.S. Pat. No. 4,801,122) discloses a seismic isolator comprising a base plate connected to a floor and a frame. A moving member such as a pivoted lever is connected to a spring in the frame and to the base plate. The object is placed on top of the frame. Movement of the foundation and base plate relative to the frame and object causes compression of the lever and extension of the spring, which then exerts a restoring force through a cable anchored to the base plate; initial resistance to inertia is caused due to friction between the base plate and the frame; this friction can be decreased by using TEFLON® or other slick low friction material.

Kondo et al., U.S. Pat. No. 4,662,133 describes a floor system for seismic isolation of objects placed thereupon comprising a floor disposed above a foundation, a plurality of support members for supporting the floor in a manner that permits the movement of the floor relative to the foundation in a horizontal direction, and a number of restoring devices disposed between the foundation and the floor member. The restoring members comprise a two pair of slidable members, each pair of slidable members being movable towards and away from each other wherein one pair of slidable members is disposed at right angles from each other in the horizontal plane.

Stiles et al., U.S. Pat. No. 6,324,795 disclose a seismic isolation system between a floor and a foundation comprising a plurality of ball and socket joints disposed between a floor and a plurality of foundation pads or piers. In this isolation device, the floor is disposed above a hardened elastomeric material (or a spring), which is in turn disposed on top of an upper surface of a ball and socket joint and thus sandwiched between the floor and the ball and socket joint. The ball and socket joint comprises an upper socket portion bearing a portion of the weight of the floor and a lower portion comprising as ball protruding upwards from a plate affixed to the foundation pad or pier. The floor is therefore able to adjust to buckling pressure due to distortion of the ground beneath the foundation piers. However, the device disclosed is not designed to move horizontally in an acceleration-resisting manner.

Fujimoto discloses a seismic isolation device similar to that of Kondo, as well as various other devices including one in which a rolling ball is disposed on the tip of a strut projecting downward from the floor in a manner similar to that of a ball point pen. The strut is received in a dish-shaped ball receiving plate. The strut may optionally be connected to a vertically disposed spring to provide a certain amount of dampening and restoring force in the vertical direction.

Bakker, U.S. Pat. No. 2,014,643, is drawn to a balance block for buildings comprising opposed inner concave surfaces with a bearing ball positioned between the surfaces to support the weight of a building superstructure.

Kemeny, U.S. Pat. No. 5,599,106 discloses ball-in-cone bearings.

All patents and patent or other publications cited in this application are hereby incorporated by reference in their entirety as part of this patent application, regardless whether any specific citation is specifically and expressly incorporated by reference or not.

The present invention provides a raised isolation flooring system for protecting objects from damage and/or injury due to seismic or other vibration of the foundation upon which the objects are supported. In a salient feature of the invention, the flooring comprises or is supported by a frame, which in turn is supported above the foundation by a plurality of pedestals. The weight of the objects on the flooring is borne by a plurality of bearings comprising at least one concave or conical surface, each such bearing comprising a ball. Preferably the bearing is a ball-in-cone bearing. The specific way in which the system is adapted to support the floor is subject to any of a number of variations, all such variations being encompassed within the present invention.

While often the foundation will comprise or be built upon a continuous concrete or other slab at a ground level of a structure, in other embodiments a foundation may include a series of piers or other projections extending upward from the base level. A foundation may exist at a level other than a ground level. For example, the term "foundation" may include a preexisting floor or custom-made floor, and this floor may be present at a ground level or a second or higher storey level of the structure.

Similarly, in the present invention, the term "floor", unless otherwise expressly stated or made clear from the context of usage, shall mean the layer of the system of the present invention upon which the objects to be isolated are placed. In certain embodiments the floor is a reinforced platform capable of use without, or incorporating, a frame.

Thus, in one preferred embodiment, the invention comprises a seismically isolated flooring system comprising:
  a) one or more horizontal flooring panels, each said panel having a top surface and a bottom surface,
  b) a frame adapted to support said flooring panel(s),
  c) a plurality of load-bearing flooring pedestals extending vertically downward from said frame, and
  d) a plurality of seismic isolation bearings, each such bearing comprising an upper load plate having a downward facing rigid load surface and a lower load plate having an upward facing rigid load surface, at least one of said surfaces defining a recessed load surface defining a conical or concave cavity with a rigid ball sandwiched between said plates,
wherein each said bearing is secured to a flooring pedestal and wherein a load placed upon the top surface of said panel(s) is transferred through said frame, pedestals and bearings to a foundation.

In a less preferred but perfectly functional embodiment the invention is drawn to a seismically isolated flooring system comprising:
  a) one or more horizontal flooring panels, each said panel having a top surface and a bottom surface,
  b) a frame adapted to support said flooring panel(s),
  c) a plurality of seismic isolation bearings,
  d) a plurality of load-bearing flooring pedestals extending vertically upward from a foundation, wherein each such bearing comprises an upper load plate having a downward facing rigid load surface and a lower load plate having an upward facing rigid load surface, at least one of said surfaces defining a recessed load surface defining a concave or conical cavity with a rigid ball sandwiched between said plates,
wherein the upper plate of each said bearing is secured to said frame and wherein the lower load plate of said bearing is secured to a flooring pedestal and wherein a load placed upon the top surface of said panel(s) is transferred through said frame, bearings and pedestals to said foundation.

In yet another embodiment the invention comprises a seismically isolated flooring system comprising:
  a) a floor,
  b) a plurality of a plurality of load-bearing flooring pedestals extending vertically downward from said floor, and
  c) a plurality of seismic isolation bearings located on a foundation,
wherein each such bearing comprising an upper load plate having a downward facing rigid load surface and a lower load plate having an upward facing rigid load surface, at least one of said surfaces defining a recessed load surface defining a concave or conical cavity with a rigid ball sandwiched between said plates,
wherein the upper plate of each said bearing is secured to said pedestal, and wherein a load placed upon the top surface of said panel(s) is transferred through said frame, bearings and pedestals to said foundation.

In a particularly preferred embodiment, the flooring system defines a void, cavity or space between the foundation and the floor itself, which void may be used to extend cable, wires and the like, such as power cables and/or networking or other digital cables for communication between computer component objects and exterior communication devices. The void can also provide airflow for efficient cooling of objects in facilities containing sensitive electrical, electronic and computer equipment, such as Information Technology (IT) facilities containing servers (for example multiblade servers), research facilities containing electron microscopes and the like, or medical facilities containing sophisticated and delicate scanning equipment and the like, that may have stringent cooling requirements.

An important advantage of the presently claimed seismic flooring system is that there is a minimum of moving parts, and the parts themselves are simple to inspect, manufacture, install, and service. Unlike previous flooring systems depending primarily on springs, coils, levers, spindles, or cables, the present flooring system does not require "tuning" after installation based on the mass of the objects to be isolated to function. The broadest aspects of the present invention have the advantage of comprising essentially only two moving parts to function: a rigid ball, and the floor and/or frame that is supported by the ball. While other "moving part" components, such as, without limitation, elastic dampers, coils, springs, pneumatic shock absorbers or snubbers made from, for example, rubber, non-rubber elastomeric materials, steel and the like, may be added to cushion or dampen the movement of the foundation relative to the floor, the major features of the presently claimed flooring system remain remarkably simple as compared to prior isolation flooring systems.

Thus, in the presently claimed isolation flooring system as lateral vibrational forces are applied to the foundation, the upper plate of the bearing is displaced relative to the lower plate due to the inertia caused by the mass of the objects to be isolated. Each bearing comprises at least one, and preferably two load surfaces (one upward facing and the other downward facing) having a concave or preferably a conical depression. The vibrations tend to displace the rigid ball sandwiched between the load plates from a central depression, resulting in the ball being raised to a higher elevation. Thus, a certain portion of the lateral energy that displaces the ball is absorbed and stored as gravitational (substantially vertical) potential energy as the ball rolls laterally to a higher elevation. This increase in gravitational force is subsequently expended by gravitational forces compelling the ball to roll downhill, returning back to the central depression and thus converting the gravitational potential energy partially back to lateral "restoring" energy.

The amount of vibrational energy required to initiate movement of the flooring (and frame, if present) in a lateral direction is dependent in large part upon factors such as the shape of the depression (concave or conical); the size of the depression, if the depression is conical the slope of the recessed cone of the lower load surface, the mass and distribution of the objects to be isolated and the rate of change of that slope.

In another embodiment, the present invention provides a seismic isolation access floor assembly including a base floor, a bearing plate coupled to the base floor, an isolator plate overlying the bearing plate, and a ball disposed between and contacting the bearing plate and the isolator plate. A floor plate is coupled to the isolator plate and together with the isolator plate forms an access floor disposed at an elevated location relative to the base floor or foundation. In a particular embodiment, there is a frame coupled to the isolator plate, and which is capable of receiving and supporting a floor plate, in which in a particular embodiment there is a floor plate supported by the frame. Further to the present invention is a substructure mounted to the base floor or foundation, and the bearing plate is mounted to the substructure and disposed at an elevated location relative to the base floor. The substructure consists of at least one upstanding pedestal having an end coupled to the base floor and an opposing end coupled to the bearing plate. The pedestal is adjustable between shortened and lengthened conditions. A first cavity is formed into the bearing plate, a second cavity is formed into the isolator plate, the first cavity confronts the second cavity, and the ball contacts first and second cavities. Preferably, the first and second cavities are each concave.

In yet another embodiment of the invention, there is provided a seismic isolation access floor assembly including a base floor, a bearing plate coupled to the base floor, an isolator plate overlying the bearing plate, a ball disposed between and contacting the bearing plate and the isolator plate, and a first floor plate coupled to the isolator plate and together forming an access floor disposed at an elevated location relative to the base floor. Further to the present embodiment is a frame coupled to the isolation plate, and the first floor plate supported by the frame. A floor plate receiving frame is coupled to the isolator plate, a second floor plate is supported by the floor plate receiving frame. A substructure is mounted to the base floor, and the bearing plate is mounted to the substructure and is disposed at an elevated location relative to the base floor or foundation. The substructure includes at least one upstanding pedestal having an end coupled to or contacting the foundation or base floor and an opposing end coupled to the bearing plate. The pedestal is adjustable between shortened and lengthened conditions. A first cavity formed into the bearing plate, a second cavity formed into the isolator plate, the first cavity confronting the second cavity, and the ball contacts the first and second cavities. The first and second cavities are each selected from the group consisting of concave cavities and conical cavities.

According to another aspect of the invention, there is provided an assembly of attached isolator plates and floor plates together forming an access floor disposed at an elevated location relative to a base floor or foundation, in which each of the isolator plates overlies a bearing plate coupled to a base floor and which is formed with a first cavity contacting a ball disposed on an opposed second cavity formed in the bearing plate. The bearing plate associated with each of the isolator plates is mounted to a substructure coupled to the base floor, in which the substructure consists of at least one pedestal. The pedestal is adjustable between shortened and lengthened conditions, and the first and second cavities are each preferably concave. In a particular embodiment, a frame attached to at least one of the isolator plates, and at least one of the floor plates is supported by the frame.

DETAILED DESCRIPTION

Figure 1:
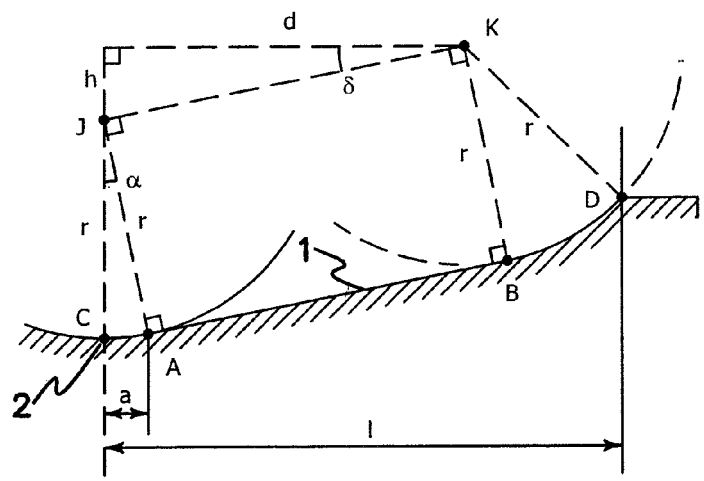
In FIG. 1 a cross-section of a shallow recessed conical load surface is shown in half profile. As can be seen, the slope of this cone surface is constant through most of its lateral distance.

The present invention is directed to novel isolation flooring systems and methods for protecting valuable and/or sensitive objects (including persons and property) from injury or damage due to seismic or other similar vibration activity, and/or to permit uninterrupted operation of such objects during such activity. The present invention is thus an elegant, cost effective, simple and practical solution to protecting such objects against, or limiting damage by, seismic or other severe vibrational energy.

In a preferred embodiment, the flooring system of the present invention does not support or is not suitable to support a building superstructure.

The presently claimed flooring systems comprise a raised floor supported either directly or indirectly by a series of pedestals. In a presently preferred embodiment of the invention, the floor is first stably supported by a frame made of material sufficiently strong to support the weight of the objects to be placed upon the flooring. Examples of useful framing material include, without limitation, steel, aluminum, titanium, iron, bronze, polymeric materials, alloys of these materials and the like. Preferably, the material is sufficiently lightweight to permit facile assembly and disassembly of the frame in situ, and to keep the overall load upon the bearings to a minimum.

The frame may be constructed using frame members arranged in any manner (often a polygonal arrangement) giving the frame sufficient structural support to adequately support the objects to be placed on it and to resist buckling during a seismic event. Since most rooms into which the present system is installed are likely to be rectangular, the frame members may commonly be arranged in a generally quadrilateral manner, such as the framing shown in FIG. 5 of this specification. However, other arrangements are possible including frame members arranged in triangular fashion, either in planar or tetrahedral fashion, or in other geometrical manners that lend the frame its strength.

Balancing the need for strength, the frame and floor is optimally not overly rigid either. Fracturing or shattering of the frame during a seismic event may result from too much rigidity. On the other hand, although the frame should be permitted to flex to a certain degree, it may be reinforced to resist buckling or sagging, or substantial movement out of the horizontal plane of the floor. Preferably bolts, screws, nots and the like are are used to join elements of the floor together, such as floor or frame elements to the isolator bearing plates and to each other. With regard to the floor plates certain of the floor plates may be joined or coupled together, such as through the use of bolts etc., while other floor plates or groups of floor plates may be left uncoupled so as to be removable and thus permit access to the void beneath the flooring for cable access and the like.

In alternative but currently less preferred embodiments the floor itself may be sufficiently reinforced to be capable of supporting the objects sufficiently well not to need the addition of a frame. In such an embodiment, the floor and frame may be therefore considered as integrated into a single flooring unit, and the system otherwise assembled and used as described herein.

In certain embodiments of the invention the isolation flooring system of the present invention may be employed in "lily pad" or "island" fashion. Thus, in certain such embodiments a conventional modular raised-access floor system (for flexible distribution of electrical, heating, cooling and/or data lines within a room or workspace) may be configured to comprise isolation islands utilizing the isolation flooring system of the present invention comprised within the conventional raised access flooring system.

For example, typical raised access flooring may comprise a plurality of reinforced quadrilateral panels; for example, square panels. In a typical embodiment, these panels or groups thereof are supported (for example, supported at each corner) by a plurality of pedestals placed on a foundation in a grid- or matrix-like arrangement. Such flooring is often useful in permitting lines, such as electrical, heating, cooling and/or data lines, to be distributed within a room or workspace without the need for such lines intruding on the raised floor itself. Utilization of the lines is made by removing one or more panel to access the line(s) in the void underneath.

Thus, the present isolation flooring system may be used in an "island" mode by removing the standard raised access flooring panels to establish a "footprint" at least in excess of that of the object to be supported. The isolation flooring system can then be built up within the space resulting from removal of the flooring panels. In such a case the floor of the isolation flooring system is advantageously also made from panels; this permits utilization of the wiring within the void of the raised access flooring by the present isolation flooring system; the wiring can then be connected to objects placed upon the isolation flooring system.

The isolation flooring system "island" should have floor dimensions at least that of the object to be supported. A gap around the perimeter of the island should also be left to permit movement or "floating" of the isolation flooring relative to the standard raised access flooring in the event of a seismic event. The width of this gap is optimally at least the radius of the lower recessed conical load surfaces of the ball in cone bearings used. Preferably, the width of the gap is up to (but need not exceed) the sum of the radius ($r_1$) of the lower recessed conical load surface and the radius ($r_2$) of the upper conical load surface. Such a gap permits the full range of motion available to the isolation island during a seismic or other vibrational event. In one embodiment this gap may be about 12 inches; in other embodiments the gap may be from about 8 inches to about 24 inches.

Of course, the "lily pad" or "island" mode of the present invention can be used in a recess in a conventional foundation as well.

Preferably, though not exclusively, the recessed concave or conical load surfaces in the bearings employed in the isolation flooring system of the present invention have a diameter in a range of about 6 inches to about 14 inches, depending in part on the strength of the maximum contemplated earthquake in the location of installation and, if the recessed surface is conical, the slope of the linear portion of the cone crosssection. Most preferably the diameter of the load surfaces is about 8 inches, or about 9 inches, or about 10 inches or about 10 inches or about 12 inches in diameter.

Additionally, when the recessed cavity of the isolation bearing is conical, preferably the slope of the linear portion of the cone cross-section is in a range of from about 5° to about 9° degrees. Again, in part this parameter can be estimated based by the strength of the maximum contemplated earthquake in the location of installation. Advantageously, no prediction of the direction of the seismic wave need be made, as the present flooring system functions equally well in simple front-to-back or side-to-side vibrations and in more complex or compound waves having diagonal or circular wave patterns. An increase in the weight of the objects to be placed on the flooring, as well as in the flooring plates and elements themselves correspond to greater inertia. Thus, although an isolation floor having a heavier object (greater load) may require a greater vibrational force to cause the isolation flooring system to move independently of the surrounding structure (particularly, to move the rigid ball from the central depression, if any), once such movement has begin, it takes a greater restoring (gravitational) force to counteract this motion and return the object to rest. Thus, with heavier equipment the conical cross section may advantageously be made less shallow (i.e., having a greater slope) to good effect. Thus, optimal slope angles may be found in the range about 6° to about 8°, or more preferably about 6.1° to about 7.7°, or more particularly about 7.7°. It will be recognized that this and every range of angles, dimensions and the like given in this patent application are understood to include explicit disclosure of every intermediate value, in tenths of an degree, as well as of the values at each end of the range. Currently preferred slope angles include 6.1° and 7.7°. The former slope may in one embodiment be used in conjunction with a 8 inch dish. The 7.7° slope may be advantageously used in conjunction with a 12-inch dish, particularly with a heavier load.

In certain embodiments, a first and second component of the isolation flooring system of the present invention may connect, engage, be affixed, be placed, inter-cooperate and the like either directly or indirectly with or to each other. Examples of indirect connection, engagement, affixation, and the like include the presence of one or more intermediate component between said first and second component. For example, an energy-absorbing agent such as a pneumatic shock absorber may be indirectly affixed to the foundation by directed connection to a hub, which itself is braced upon or otherwise stably affixed to the foundation. Alternatively non-pneumatic braces may be used.

The ball to be used in the ball-in-cone bearing is preferably a rigid, uncoated ball bearing, although rubber or elastomer-coated balls, synthetic balls and the like may be exclusively utilized in less preferred embodiments. Additionally, a combination of such uncoated, low friction balls may be used in combination with a number of coated, higher friction rigid balls, with the latter ball type acting as a damper to absorb energy by friction. The ball may comprise stainless steel, or any hard metal or metal alloy that is able to support a weight of at least about 1000 lb. Similarly, the recessed concave or conical load plates are manufactured from similarly strong materials.

Additionally, the flooring system of the present invention comprises a plurality of such bearings, preferably sufficient to stably support the flooring without substantial movement except in the event of a seismic vibration. For a quadrilateral floor, this generally means at least one such bearing will be placed at or near each of the four corners of the frame (or flooring if the floor is independently reinforced. Also additional bearings are placed in a manner so as to prevent the frame and/or flooring from sagging or buckling, with due account being taken for the load tolerance of each individual bearing (e.g., 1000 lbs) and the total flooring load and distribution thereof, when calculating the total number and distribution of bearings to be utilized. The bearings may make up a matrix of attached bearings across the floor.

In a particularly preferred embodiment, the flooring system of the present invention is made so as to have about 12 inches of system displacement, and about 0.15 g to about 0.20 g floor accelerations, where g is equal to the amount of gravitational acceleration.

Also disclosed herein is a dampening system for an isolation flooring system comprising a hub placed or otherwise affixed upon the foundation and supported in an upright position by a plurality of bracing members extending outward from the hub and terminating on the foundation. Preferably the bracing members terminate at a distal end in a pad, which stabilizes the hub in an upright position. Radiating outward from the hub are two or more (preferably three or more; even more preferably four or more) energy absorbing elements affixed directed or indirectly at their proximal end to the frame or flooring. Preferably, the distal end of each energy absorbing element is affixed to a load-bearing pedestal.

The flooring panels to be used in the flooring system of the present invention may comprise any appropriate material (including metal, fiberglass, plastic or composite materials). The flooring system may comprise a single panel, or in other embodiments, may comprise more than one such panel. Preferably, the system comprises two or more flooring panels; additionally, the panels are preferably of a regular shape and are thus substantially interchangeable. Certain flooring panels may be modified to comprise access apertures through which, for example, cables, wire, and other materials may be fed for connection with the supported objects to be isolated. Preferably, the flooring panels may be of a standard polygonal shape, for example, square, and of a standard size. A particularly advantageous size is about 2 feet×2 feet, which is the size and shape of many standard raised access floor tiles. Particularly appropriate for computer, IT, and other equipment having exacting cooling requirements the present isolation flooring system may employ standard perforated tiles to permit venting and cooling of air circulating between the flooring and the foundation.

In a preferred embodiment of the invention, the frame comprises cable trays, ties, or other securing means so that power, data, and other such cables move with the isolation flooring rather than with the surrounding structure during a seismic or other vibrational event to permit the isolated objects to remain powered and operational during and after such event, and to reduce the possibility of severe stress and strain on these cables.

It is usually desirable to couple the frame elements with other frame elements (such as braces) and with flooring panels, and at times to couple one or more flooring plates together to prevent collapse. In a preferred method, these elements are bolted together The isolation flooring may be used with or without dampening energy-absorbing elements, such as elastic components, including springs, coils, and elastomeric materials such as rubber or plastic belts, braces or pneumatic components such as pneumatic shock absorbers. In a preferred embodiment, the frame and/or pedestals of the present invention are cushioned by one or more dampening energy-absorbing element. Such element(s) may, for example, protect the floor and/or frame from buckling or sagging or cause the floor to return to its rest position more quickly than would otherwise occur. In a particularly preferred embodiment, a hub is placed on or affixed to the foundation and two or more energy absorbing elements connected radially from the hub and pedestal or frame attachment locations. In this embodiment, during the seismic or other vibrational event the hub moves with the foundation and the flooring is isolated from such movement. The hub may be supported in an upright posture by reinforcing pads and struts.

The present isolation flooring system may permit the flooring to be raised to a level of up to about 4 feet or about 3 feet or about 2 feet or about 1 foot above the foundation, or any other height suitable for the objects to be isolated, taking into consideration any cavity or void required between the flooring and foundation for equipment cooling or for extending, for example, electrical, data transfer, and other cables, wires, or other lines.

The examples which follow are illustrations of some preferred embodiments of the invention, but are not intended to limit the scope of the invention to these embodiments.

Turning now to FIG. 1, a half cross sectional diagram of the shallow conical region of a recessed conical load surface, and the geometry involved is shown. The cone apex (2) is the ball's resting point (C). A rigid ball of radius (r) can travel up from contact position A to point B, where it will touch the recess point (D) as well. During this displacement, the ball center point moves from J to K; therefore, a vertical rise (h) is achieved on a lateral distance (d). The contact angle at rest is α and the rise angle is δ. Distance (a) is the contact radius at rest. The total horizontal distance corresponding to CD is the cone radius, as well as the recess radius. Since line AB defines a linear slope, the restoring force on the bearing is constant. That is, the first derivative of a slope in respect to its base is constant.

Figure 2:
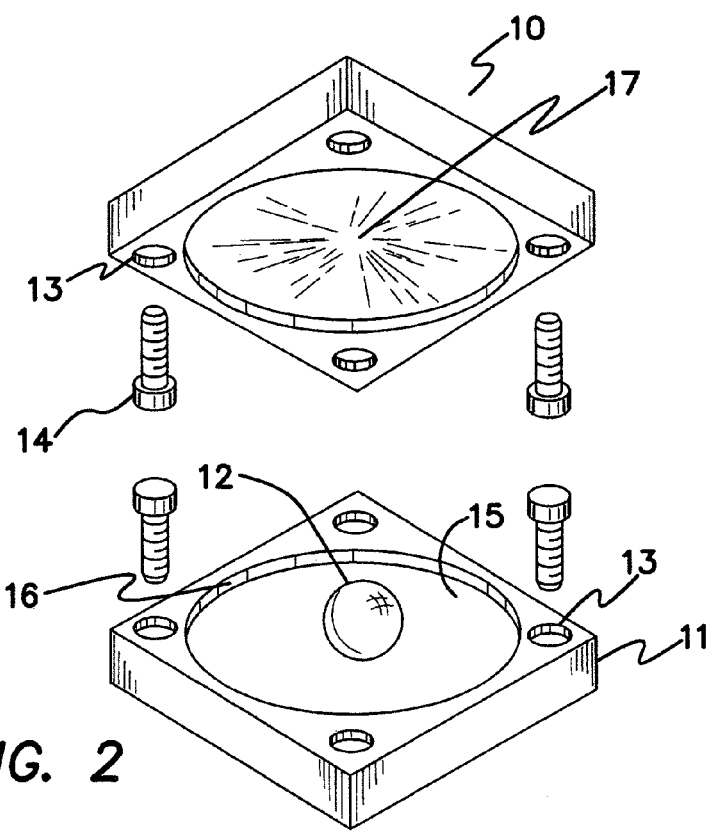
FIG. 2 shows a ball in cone bearing in exploded perspective.

Turning to FIG. 2, an exploded view of an embodiment of a ball in cone bearing is provided. As shown, the bearing comprises an upper plate (10) and a lower plate (11), each having recessed conical load surfaces, with a rigid ball (12) sandwiched between them. The recessed conical load surfaces each comprise a apex (17), a region of substantially constant slope (15) and a recess perimeter (16). In this embodiment the upper and lower plates may be directly or indirectly bolted to the frame and/or flooring and the foundation, respectively, by means of bolts (14) and corresponding holes (13) in the plates. In some embodiments the upper plate of the bearing is bolted to otherwise affixed to a pedestal projecting downward from the frame or flooring, and thus indirectly affixed to said frame or flooring. In other embodiments, the upper plate may be directly affixed to the frame or flooring. The lower plate similarly may be indirectly attached to the foundation, such as by means of a pier or pedestal, or directly attached thereto.

Figure 3:
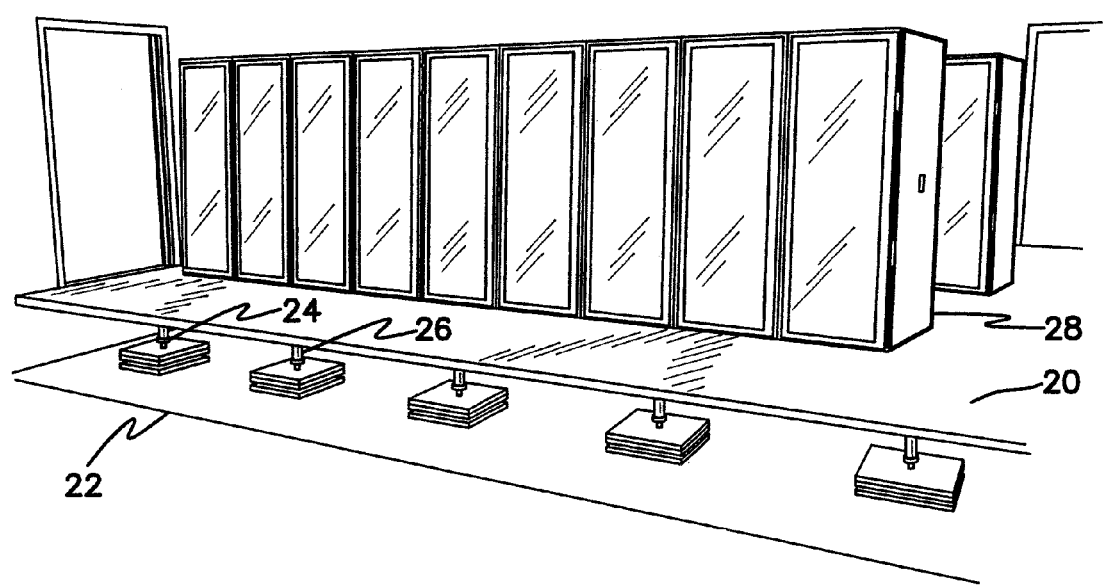
FIG. 3 shows an embodiment of the raised isolation flooring system of the present invention.

FIG. 3 is drawn to one embodiment of the raised access isolation flooring system of the present invention comprising a raised floor (20), supported by a series of pedestals (26) affixed to ball-in-cone bearings (24) placed on or affixed to a foundation (22). In this embodiment of the invention the flooring may support, for example, supports a plurality of computer servers or mainframes (28).

Figure 4:
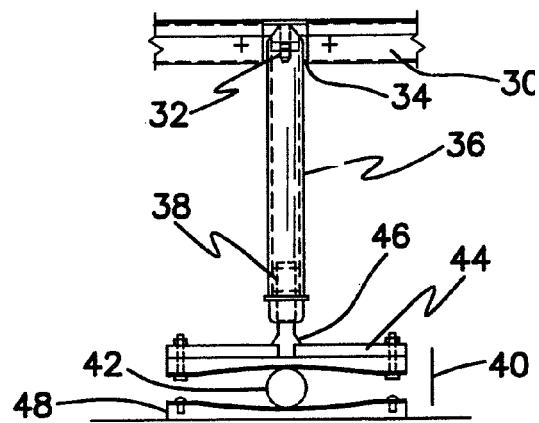
FIG. 4 is drawn to an embodiment of the present invention in which a pedestal is affixed to a frame at an upper end and to the upper plate of a ball in cone bearing at the other end.

FIG. 4 is drawn to a currently preferred embodiment of the present invention in which a pedestal (36) comprises a hollowed tip (38) or other fitting at a lower end for receiving a post or nipple (46) located on an upper bearing plate (44) portion of a ball and cone bearing (40). The bearing also comprises a rigid ball (42), which rests upon a lower bearing plate (48). The upper portion of the pedestal (32) is received by a fitting, void or recess (34) on a frame (30) supporting the floor. Other embodiments of this portion of the invention shall, in light of the present disclosure, become immediately apparent to the person of ordinary skill in the art, such as, without limitation, embodiments whereby either or both ends of the pedestal may be bolted or otherwise affixed to the frame or flooring and/or the foundation, or embodiments wherein the lower end of the pedestal is adapted to be inserted into a recess in the upper bearing plate.

Figure 5:
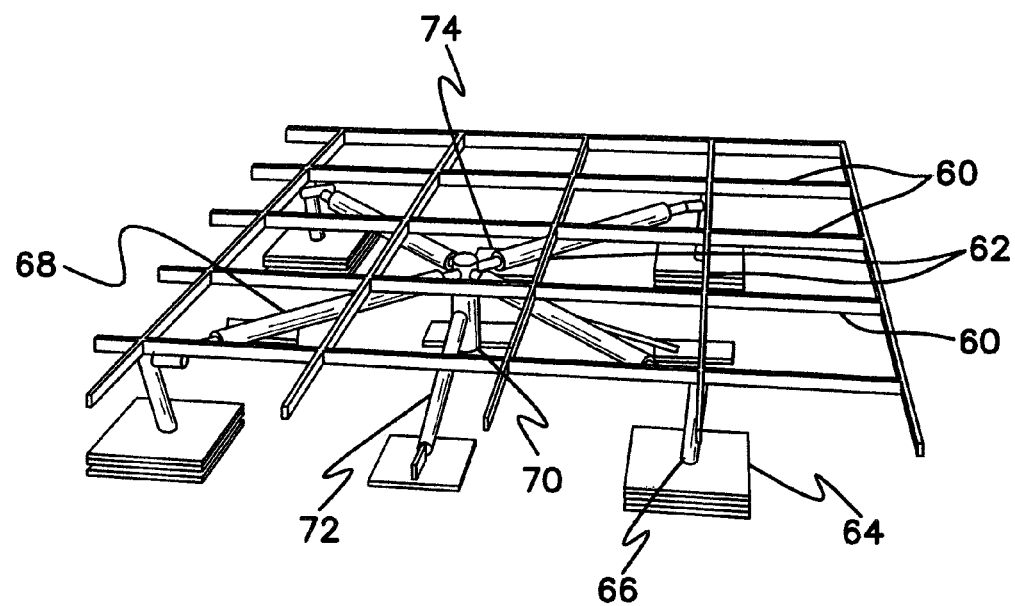
FIG. 5 illustrates a further embodiment of the invention in which the frame is dampened by energy absorbing elements during a vibrational event, such as an earthquake, against movement of the isolation flooring system of the present invention relative to the foundation.

In another embodiment of the present invention, a dampening system is illustrated. In FIG. 5, a frame of the flooring system comprises substantially regularly spaced first frame members (60) crossing regularly spaced second frame members (62), in this case, at right angles. Ball in cone bearings (64) support the frame and flooring through pedestals (66) to which both bearing and frame are secured. Separate pedestals are linked to a central hub (70) by snubbing or dampening means, in this case, by a proximal end of a pneumatic shock absorber (68), the distal end of which is attached to a nearby pedestal. Thus, all said pedestals are linked by means of the central hub. The hub is itself supported by struts (72) and pads (74) on the foundation.

All references, articles, publications and patents and patent applications cited herein are incorporated by reference in their entireties.

While this invention has been described with respect to various specific examples and embodiments, it is to be understood that the invention is not limited thereto and that it can be variously practiced within the scope of the following claims.

What is claimed is:

1. A method for cushioning an object from the full acceleration provided by an external vibration, comprising:
    placing said object on an isolating flooring system that provides seismic isolation restoring force without springs or coils, said system comprising:
    a. one or more horizontal flooring panels, each said panel having a top surface and a bottom surface,
    b. a frame adapted to support said flooring panel(s),
    c. a plurality of load-bearing flooring pedestals extending vertically downward from said frame, and
    d. a plurality of seismic isolation bearings, each such bearing comprising
        i. an upper load plate having a downward facing rigid load surface and defining a recessed load surface comprising a concave or conical surface;
        ii) a lower load plate having an upward facing rigid load surface opposing and substantially identical to the load surface of the upper load plate, and defining a recessed load surface comprising a concave or conical surface; wherein said opposing load surfaces define a cavity; and
        iii) a ball disposed within said cavity; wherein each said bearing is directly or indirectly secured to a flooring pedestal, wherein a load placed upon the top surface of said one or more panels is transferred through said frame, pedestals and bearings to a foundation, wherein the flooring system is structured so that a lateral vibrational force applied to the foundation causes the upper plate of a bearing to be displaced relative to the lower plate of the bearing, and wherein a gap permitting a full range of motion is maintained around the perimeter of the system;
    whereby during an external vibration the isolating flooring system cushions said object from the full acceleration provided by said external vibration.

2. The method of claim 1 wherein the external vibration is a seismic tremor.

3. The method of claim 1 wherein the object comprises at least one microprocessor.

4. The method of claim 1 wherein the upper load plate of at least one said bearing is secured to a lower end of a corresponding pedestal, and wherein the lower load plate of said bearing is positioned directly or indirectly on said foundation.

5. The method of claim 1 wherein the upper load plate of each said bearing is secured to a bottom end of a corresponding pedestal, and wherein the lower load plate of each said bearing is positioned directly or indirectly on said foundation.

6. The method of claim 1 wherein said recessed load surface of the bearings of said flooring system comprises a central apex, a recess perimeter, and a conical region extending therebetween.

7. The method of claim 6 wherein said recess perimeter comprises a circumference defining said recessed load surface therewithin.

8. The method of claim 1 wherein said object is attached to a conduit selected from the group consisting of a utility connection, a data connection, and a water connection to an unisolated structure, and said conduit is led through a cavity defined between the flooring panels and the foundation, the vertical height of the cavity determined at least in part by the length of the pedestals of said flooring system.

9. The method of claim 8 wherein said conduit is a electrical power cable.

10. The method of claim 9 wherein said conduit transmits electronic communication between individual equipment modules.

11. The method of claim 1 in which said flooring system is subject to a substantially constant restoring force.

12. The method of claim 1 in which said flooring system is subject to a 100% gravitational restoring force.

13. The method of claim 1 further comprising the step of slowing the acceleration of said flooring system during a vibrational event by using damping means.

14. The method of claim 13 wherein said damping means comprises at least one energy absorbing element directly or indirectly affixed to the foundation at a proximal end and to the frame or flooring at a distal end.

15. The method of claim 14 wherein said at least one energy absorbing element is selected from the group consisting of an elastic component and a pneumatic element.

16. The method of claim 15 wherein the energy absorbing element comprises a pneumatic component.

17. The method of claim 16 wherein said dampening means comprises an elastic component.

18. The method of claim 15 wherein the energy absorbing element is directly connected to a hub braced upon the foundation at a proximal end and to a load bearing pedestal at a distal end.

19. The method of claim 15 wherein said damping means comprises three or more energy absorbing elements directly or indirectly affixed to the foundation at a proximal end and to the frame or flooring at a distal end.

* * * * *